(12) United States Patent
Rofougaran et al.

(10) Patent No.: US 8,437,706 B2
(45) Date of Patent: *May 7, 2013

(54) METHOD AND SYSTEM FOR TRANSMISSION OR RECEPTION OF FM SIGNALS UTILIZING A DDFS CLOCKED BY AN RFID PLL

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,036

(22) Filed: Apr. 5, 2011

(65) Prior Publication Data

US 2011/0183631 A1 Jul. 28, 2011

Related U.S. Application Data

(63) Continuation of application No. 11/754,407, filed on May 29, 2007, now Pat. No. 7,920,893.

(51) Int. Cl.
*H04B 1/38* (2006.01)

(52) U.S. Cl.
USPC ............ 455/73; 455/76; 455/165.1; 455/142

(58) Field of Classification Search ............... 455/552.1, 455/41.2, 185.1; 340/10.1, 572.1, 5.53
See application file for complete search history.

(56) References Cited

U.S. PATENT DOCUMENTS

| | | | |
|---|---|---|---|
| 5,130,671 A | 7/1992 | Shahriary et al. | |
| 5,598,437 A | 1/1997 | Gourse | |
| 6,069,505 A | 5/2000 | Babanezhad | |
| 6,181,218 B1 | 1/2001 | Clark et al. | |
| 6,198,353 B1 | 3/2001 | Janesch et al. | |
| 6,366,174 B1 | 4/2002 | Berry et al. | |
| 6,628,163 B2 | 9/2003 | Dathe et al. | |
| 6,646,581 B1 | 11/2003 | Huang | |
| 6,791,425 B2 | 9/2004 | Kitamura | |
| 6,836,154 B2 | 12/2004 | Fredriksson | |
| 6,842,710 B1 | 1/2005 | Gehring et al. | |
| 7,046,098 B2 | 5/2006 | Staszewski | |
| 7,302,237 B2 * | 11/2007 | Jackson et al. | 455/76 |
| 7,317,363 B2 | 1/2008 | Kousai et al. | |
| 7,342,497 B2 | 3/2008 | Chung et al. | |
| 7,356,423 B2 | 4/2008 | Nehrig | |
| 7,432,751 B2 | 10/2008 | Fang | |
| 7,664,475 B2 * | 2/2010 | Ichihara | 455/168.1 |
| 2002/0126013 A1 * | 9/2002 | Bridgelall | 340/572.1 |

(Continued)

*Primary Examiner* — Kamran Afshar
*Assistant Examiner* — Shahriar Behnamian
(74) *Attorney, Agent, or Firm* — Farjami & Farjami LLP (57) ABSTRACT

Aspects of a method and system for transmission or reception of signals utilizing a DDFS clocked are provided. A first oscillator signal utilized for transmission and/or reception of signals of a first wireless communication protocol may be generated, and a direct digital frequency synthesizer (DDFS) may be clocked by the first oscillator signal to generate one or more second oscillator signals. The one or more second oscillator signals may be modulated to generate a signal adhering to a second wireless communication protocol. The one or more second oscillator signals may be utilized to demodulate signals of the second wireless communication protocol. A control word input to the DDFS may control a frequency of the one or more second oscillator signals generated by the DDFS. Simultaneous transmission and reception of signals of the second wireless communication protocol may be simulated by switching the control word input to the DDFS between two values.

18 Claims, 8 Drawing Sheets

U.S. PATENT DOCUMENTS

| | | |
|---|---|---|
| 2004/0184559 A1 | 9/2004 | Ballantyne |
| 2005/0253646 A1 | 11/2005 | Lin |
| 2006/0072647 A1 | 4/2006 | Feher |
| 2007/0030116 A1* | 2/2007 | Feher .................... 340/5.53 |
| 2007/0064843 A1 | 3/2007 | Vavelidis et al. |
| 2007/0066272 A1 | 3/2007 | Vassiliou et al. |
| 2007/0087750 A1 | 4/2007 | Uchida |
| 2007/0091988 A1 | 4/2007 | Sandri et al. |
| 2007/0207759 A1 | 9/2007 | Vavelidis et al. |
| 2007/0207760 A1 | 9/2007 | Kavadias et al. |
| 2008/0180220 A1 | 7/2008 | Hollister et al. |
| 2008/0205542 A1 | 8/2008 | Rofougaran |

* cited by examiner

METHOD AND SYSTEM FOR TRANSMISSION OR RECEPTION OF FM SIGNALS UTILIZING A DDFS CLOCKED BY AN RFID PLL

CROSS-REFERENCE TO RELATED APPLICATIONS/INCORPORATION BY REFERENCE

This application is a continuation of U.S. patent application Ser. No. 11/754,407 filed on May 29, 2001.

This application also makes reference to:
U.S. patent application Ser. No. 11/754,481 filed on May 29, 2007;
U.S. patent application Ser. No. 11/754,460 filed on May 29, 2007;
U.S. patent application Ser. No. 11/754,581 filed on May 29, 2007;
U.S. patent application Ser. No. 11/754,621 filed on May 29, 2007;
U.S. patent application Ser. No. 11/754,490 filed on May 29, 2007;
U.S. patent application Ser. No. 11/754,708 filed on May 29, 2007;
U.S. patent application Ser. No. 11/754,768 filed on May 29, 2007;
U.S. patent application Ser. No. 11/754,705 filed on May 29, 2007;
U.S. patent application Ser. No. 11/754,600 filed on May 29, 2007; and
U.S. patent application Ser. No. 11/754,438 filed on even date herewith.

Each of the above stated applications is hereby incorporated herein by reference in its entirety.

FIELD OF THE INVENTION

Certain embodiments of the invention relate to signal processing. More specifically, certain embodiments of the invention relate to a method and system for transmission or reception of FM signals utilizing a DDFS clocked by an RFID PLL.

BACKGROUND OF THE INVENTION

With the growing popularity of portable electronic devices and wireless devices that support audio applications, there is a growing need to provide a simple and complete solution for audio communications applications. Additionally, with the growing popularity of RFID technologies, there is a need to provide a simple and complete solution for integrating RFID into portable electronic devices such as wireless handsets. In this regard, FM transmission, FM reception, and/or RFID may all be integrated into a single device. For example, a portable electronic device such as a wireless handset may play stored audio content and/or receive audio content via broadcast communication. In this regard, the device may receive or transmit conventional FM radio signals. Additionally, portable devices such as wireless handsets are increasingly being used, for example, as a replacement for conventional RFID badges and smart cards. For example, RFID enabled wireless handsets may be utilized in a manner similar to smart cards and may be utilized to store account information for the purchase of goods and services. In this manner, a user may, for example, simply hold his wireless handset up to a terminal and have funds automatically deducted from his account.

However, integrating support for FM transmission, FM reception, and RFID into, for example, a wireless handset may be costly. In this regard, combining FM radio and RFID services into a portable electronic device or a wireless device may require separate processing hardware and/or separate processing software. Furthermore, simultaneous use of a plurality of radios in a portable device may result in significant increases in power consumption. Power being a precious commodity in most portable devices, combining an FM radio and RFID services into a single device may require careful design and implementation in order to minimize battery usage. Additional overhead such as sophisticated power monitoring and power management techniques are required in order to maximize battery life.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for transmission and reception of FM signals utilizing a DDFS clocked by an RFID PLL, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for transmission or reception of FM signals utilizing a DDFS clocked by an RFID PLL. In this regard, one or more signals utilized to transmit or receive FM communication, such as the I and Q signals of FIG. 4A, may be generated by clocking a DDFS, such as the DDFS 422 of FIG. 4A, via a signal generated to enable RFID communication. The signal that enables RFID communication and clocks the DDFS may be within one of several common frequency bands utilized for RFID communication. These frequency bands may include 868 MHz to 928 MHz, 2.4 GHz to 2.483 GHz, and 5.725 to 5.875 GHz. These frequencies may be generated by a PLL which may be a simple fixed-frequency PLL. The signals output by the DDFS may comprise in-phase and quadrature phase components, as shown by I and Q in FIGS. 4A and 4B. The signals output by the DDFS may fall within a frequency band of 60 MHz to 130 MHz.

Figure 4A:
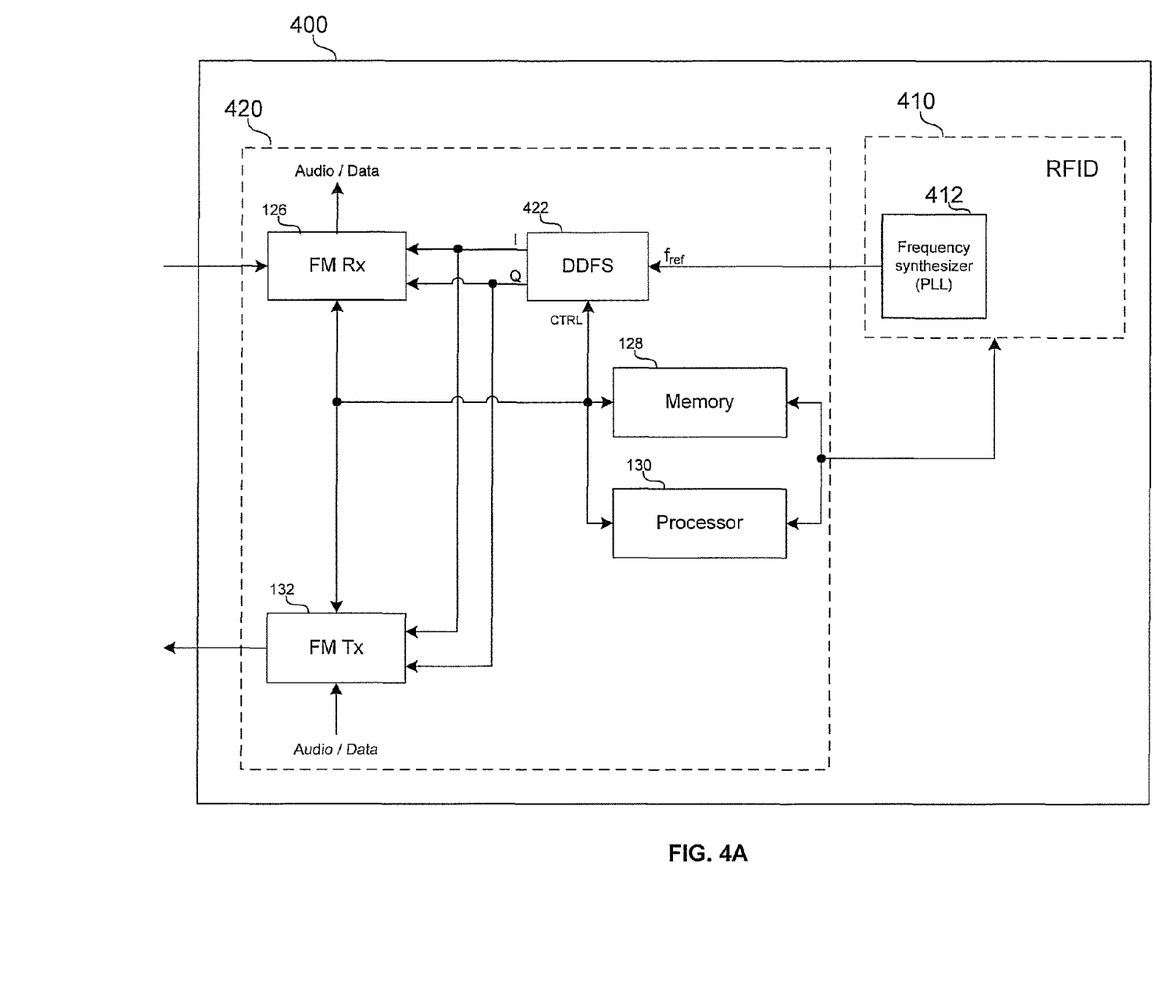
FIG. 4A is an exemplary diagram of a System on Chip (SoC) with integrated RFID and FM radios, in accordance with an embodiment of the invention.

The DDFS may be controlled via a control word (CTRL in FIG. 4A) from a processor, such as the processor 130 disclosed in FIG. 4A. In this regard, the control word may determine a frequency and/or phase of the signals output by the DDFS. The control word may be switched between two or more values to generate different frequencies and/or phases in different time intervals. Accordingly, by switching between a transmit frequency and/or phase and a receive frequency and/or phase in alternating time intervals, aspects of the invention may enable simulating the simultaneous transmission and reception of FM signals. Additionally, the control word may be adjusted to maintain a constant phase and/or frequency in spite of changes to the signal clocking the DDFS.

Figure 1:
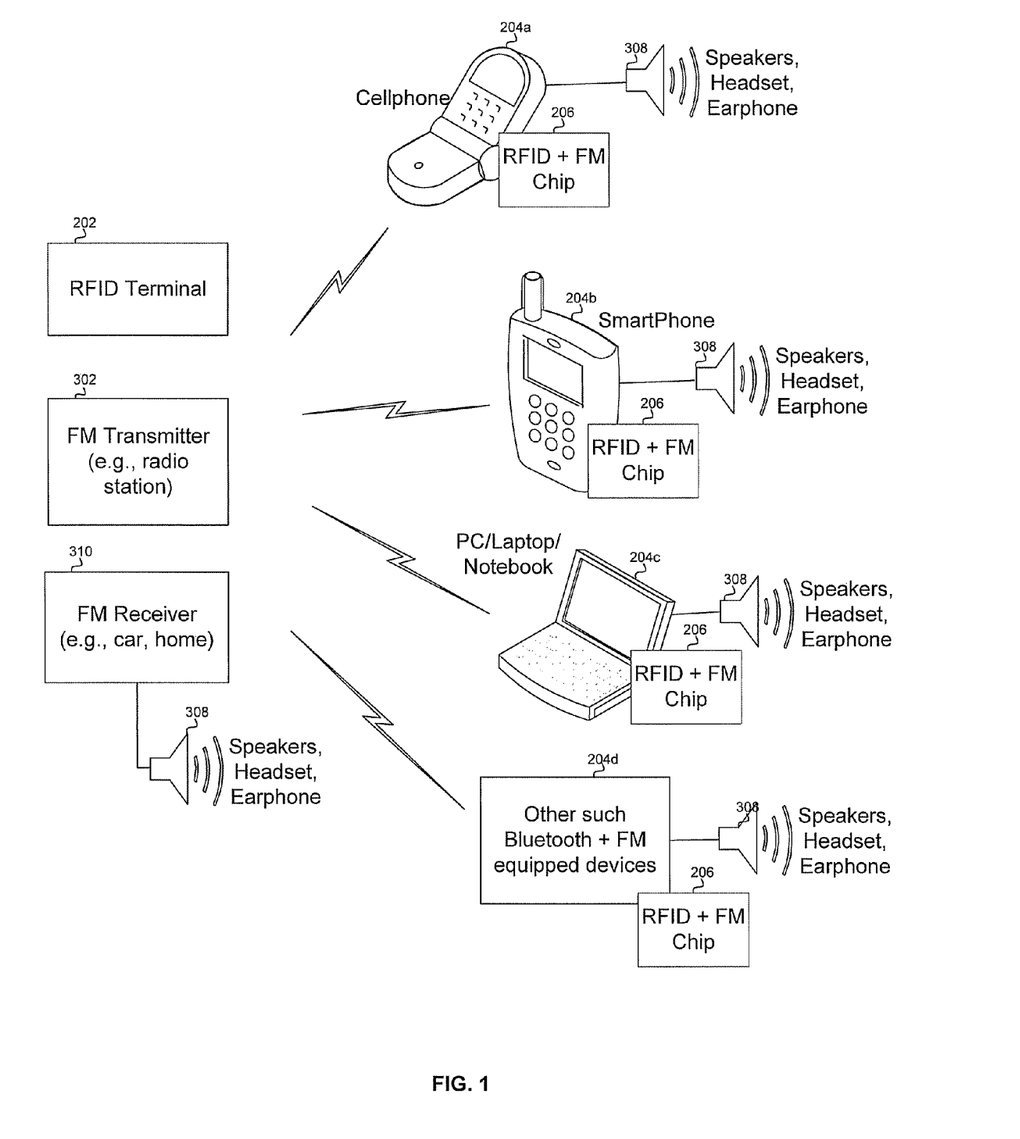
FIG. 1 is a diagram of exemplary handheld devices that communicate with an RFID terminal, an FM transmitter, and/or a FM receiver utilizing a single chip with integrated RFID and FM radios, in accordance with an embodiment of the invention.

FIG. 1 is a diagram of exemplary handheld devices that communicate with an RFID terminal, an FM transmitter, and/or a FM receiver utilizing a single chip with integrated RFID and FM radios, in accordance with an embodiment of the invention. Referring to FIG. 1, there is shown an RFID terminal 202, a FM transmitter 302, a FM receiver 310, and a number of wireless devices including a wireless handset 204a, a smart phone 204b, a computer 204c, and an exemplary FM and RFID-equipped device 204d.

The RFID transmitter 202 may be implemented as part of a security system or toll station, for example. Each of the wireless handset 204a, the smart phone 204b, the computer 204c, and the exemplary FM and RAD-equipped device 204d may comprise a single chip 206 with integrated RFID and FM radios for supporting FM and RFID data communications. The RFID terminal 202 may enable communication of RFID data between itself and the devices shown by utilizing the single chip 206. Accordingly, the various wireless devices shown in FIG. 1 may be enabled to transmit and receive RFID signals to/from the RFID terminal 202. The user of each device may, for example, hold it near the terminal to provide a means of identifying him or herself. In another example, the devices may communicate with the terminal 202 to perform a secure operation such as completing a financial transaction. In this regard, account information may be stored in a central database accessed by the terminal 202, or account may be stored locally on the device.

The FM transmitter 302 may be implemented as part of a radio station or other broadcasting device, for example. The FM transmitter 302 may enable communication of FM audio data to the devices shown in FIG. 3A by utilizing the single chip 206. Accordingly, the various wireless devices shown in FIG. 1 may be enabled to receive FM audio data. In this regard, each of the devices in FIG. 3A may comprise and/or may be communicatively coupled to a listening device 308 such as a speaker, a headset, or an earphone, for example.

The FM receiver may be enabled to receive FM audio data and may be associated with an audio system. For example, the FM receiver may be implemented as part of a car stereo. Accordingly, the various wires devices may be able to broadcast a signal to a "deadband" of an FM receiver for use by the associated audio system. For example, the smart phone 204b may transmit a telephone call for listening over the audio system of an automobile, via usage of a deadband area of the car's FM stereo system. This may provide a universal ability to use this feature with all automobiles equipped simply with an FM radio with few, if any, other external FM transmission devices or connections being required. In another example, a computer, such as the computer 204c, may comprise an MP3 player or another digital music format player and may broadcast a signal to the deadband of an FM receiver in a home stereo system. The music on the computer may then be listened to on a standard FM receiver with few, if any, other external FM transmission devices or connections.

While a wireless handset, a smart phone, and computing devices have been shown, a single chip that combines a RFID and FM transceiver and/or receiver may be utilized in a plurality of other devices and/or systems that receive and use an FM signal.

Figure 2:
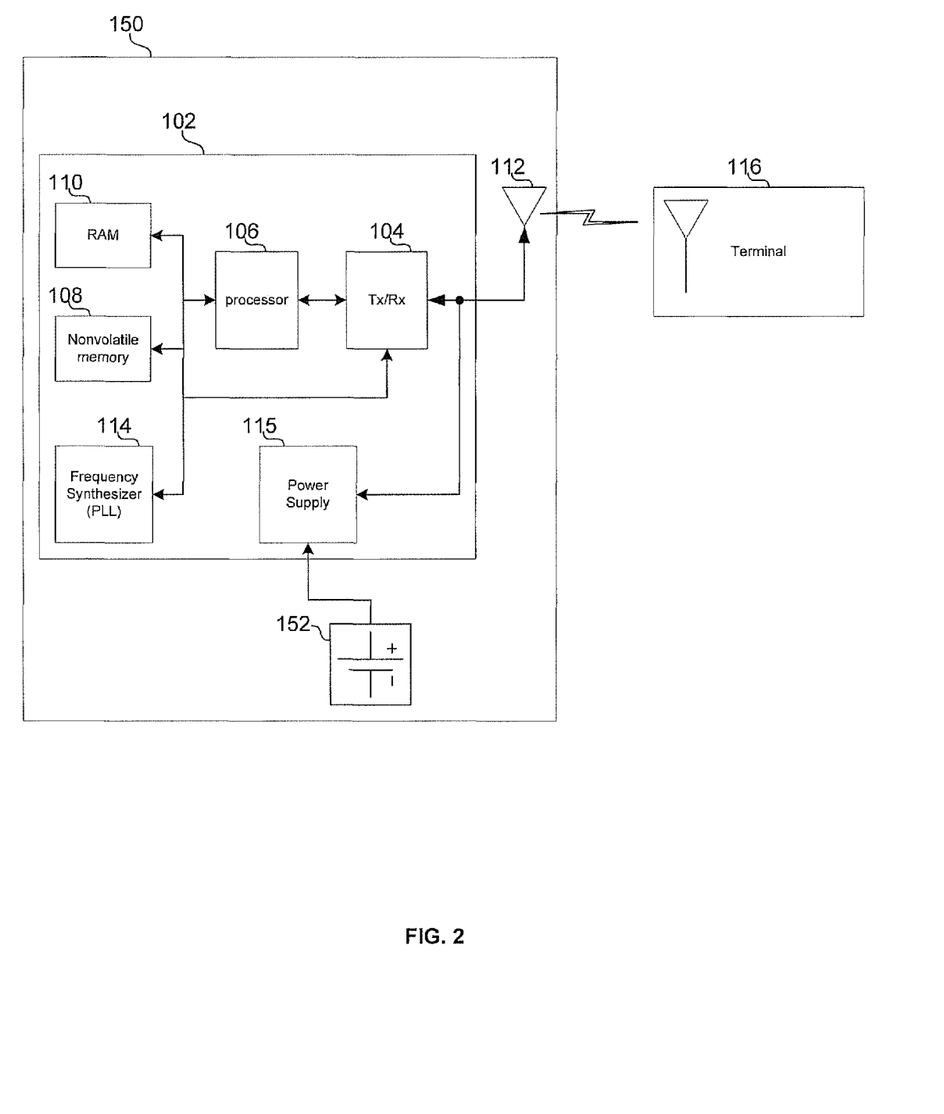
FIG. 2 is a block diagram of an exemplary RFID system, in connection with an embodiment of the invention.

FIG. 2 is a block diagram illustrating an exemplary RFID system in connection with an embodiment of the invention. Referring to FIG. 2, the exemplary system 102 may comprise an Tx/Rx block 104, a processor 106, a nonvolatile memory 108, a RAM 110, an antenna 112, a frequency synthesizer 114, and a power supply 115. The exemplary system 102 may, for example, be an integrated system on chip (SoC). The system 102 may, for example, be integrated into a smart card or a portable electronic device 150.

The Tx/Rx block 104 may comprise suitable logic, circuitry, and/or code which may enable communication between the system 102 and the terminal 116. The Tx/Rx block 104 may, for example, be enabled to demodulate a received signal and pass the resulting data to the processor in the form of a bitstream. Similarly, the Tx/Rx block 104 may be enabled to modulate a carrier signal with the information comprising a bitstream received from the processor 106 and/or the memory 108.

The processor 106 may comprise suitable logic, circuitry, and/or code which may enable processing and/or storing data to/from the Tx/Rx block 104, the nonvolatile memory 108, the RAM 110, and the frequency synthesizer 114. In this regard, the processor 106 may enable processing received data and/or processing of data to be transmitted to the terminal 116. For transmitting data, the processor may be enabled to control the Tx/Rx block 104 to modulate information onto a RF carrier.

The nonvolatile memory 108 may comprise suitable logic, circuitry, and/or code which may enable storing data when the system 108 is not powered. The nonvolatile memory 108 may store a set of instructions comprising a boot sequence to load and initialize an operating system. Accordingly, upon connecting to a terminal, the system 102 may power up and the processor 106 may execute the boot sequence.

The RAM 110 may comprise suitable logic, circuitry, and/or code which may enable storing data while the system 102 is powered. The RAM 110 may comprise one or more instructions which may be utilized by processor 106. In this regard, the RAM 110 may be loadable by the terminal 116 and, upon the terminal 116 being validated and/or authenticated, the processor 106 may be enabled to execute instructions from the RAM 110.

The antenna 112 may comprise suitable logic, circuitry, and/or code for coupling electric and/or magnetic fields from the terminal 116 to the system 102. In this manner, an external magnetic and/or electric field may impress a current in the antenna 112. Similarly, the antenna 112 may enable transmitting signals output by the Tx/Rx block 104. The antenna 112 may be integrated into the system 102 or may be external.

The frequency synthesizer 114 may comprise suitable logic, circuitry, and/or code that may enable generation of fixed or variable frequency signals. For example, the clock generation block 114 may comprise one or more PLLs to generate one or more signals of variable frequency based on a single fixed frequency reference signal. In this regard, the PLL may comprise a fixed-frequency, a "divide by N", or a "fractional N" architecture. Accordingly, the frequency synthesizer 114 may generate a carrier signal which may be modulated the Tx/Rx block 104. In this regard, frequencies generated by the frequency synthesizer 114 may include, but are not limited to 868 MHz to 928 MHz, 2.4 GHz to 2.483 GHz, and/or 5.725 to 5.875 GHz.

The power supply 115 may comprise suitable logic, circuitry, and/or code that may enable powering the system 102. In this regard, the power supply 115 may, for example, comprise a battery or other power source. Alternatively, the system 102 may be integrated into a portable electronic device 150, as shown in FIG. 2, and may receive power from the portable electronic device's power supply 152. In this regard, the power supply 115 may, for example, enable the conditioning and/or distribution of voltages or currents received from the electronic device.

In an exemplary operation, the frequency synthesizer 115 may generate one or more signals used by the system 102 for clocking the various blocks of the system 102. Upon receiving a stable clock signal the processor 106 may execute a boot sequence from instructions stored in the non-volatile memory 108. In this regard, the boot sequence may comprise performing one or more operations to establish communication with the terminal 116. For example, the processor 106 may determine the type of terminal to which the system 102 may be interfacing and the rate and format of information to be exchanged via the Tx/Rx block 104. Upon establishing communication, the boot sequence may comprise performing one or more operations to validate and/or authenticate the terminal 116. Subsequent to establishing communication with the terminal, the system 102 may perform a variety of operations. In this regard, the system 102 may, for example, be utilized for identifying the system 102 or for purchasing goods and services using account information stored in the system 102. Accordingly, the system 102 may, for example, may be integrated into a "smart phone". The system 102 represents only one embodiment of a RFID system and actual RFID systems may vary widely in complexity, manner of operation, functions performed, and other characteristics. Notwithstanding these variations, any RFID system comprising a signal generation circuit similar to or the same as the frequency synthesizer 114 may be utilized in accordance with an embodiment of the invention.

Figure 3A:
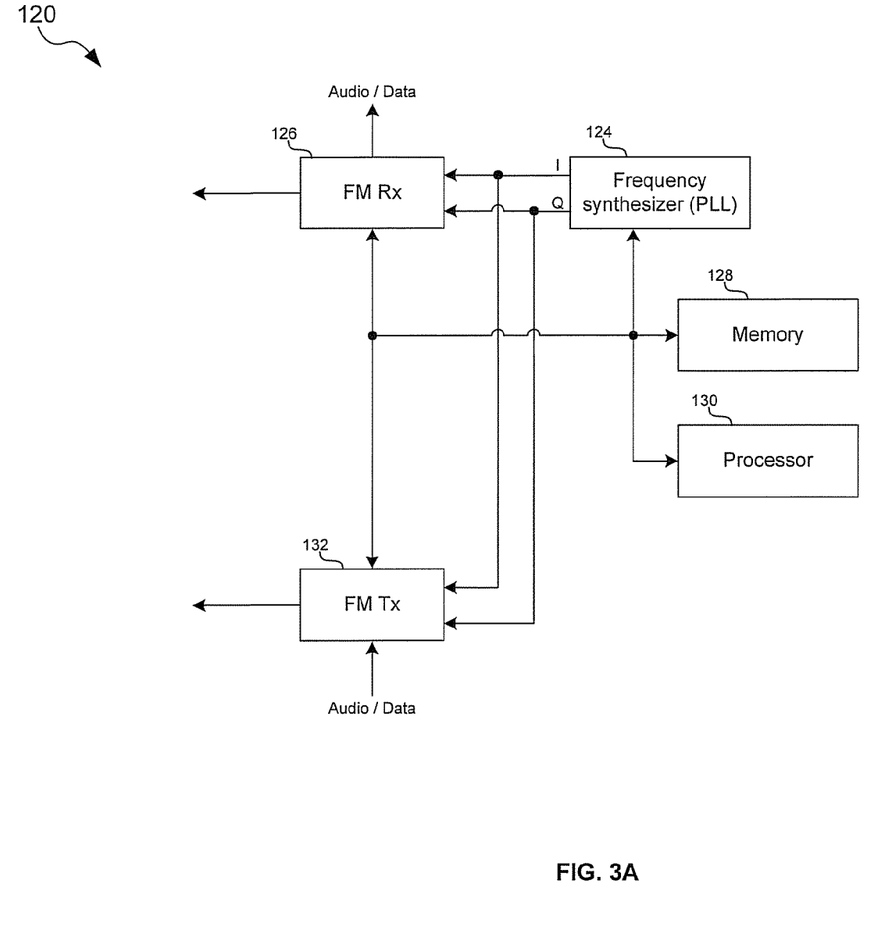
FIG. 3A is a block diagram of an exemplary system for FM transmission and/or FM reception, in connection with an embodiment of the invention.

FIG. 3A is a block diagram of an exemplary system for FM transmission and/or FM reception, in connection with an embodiment of the invention. Referring to FIG. 3A the radio 120 may comprise a frequency synthesizer 124, an FM receive (Rx) block 126, a memory 128, a processor 130, and a FM transmit (Tx) block 132.

The frequency synthesizer 124 may comprise suitable logic, circuitry, and/or code that may enable generation of fixed or variable frequency signals. For example, the frequency synthesizer 124 may comprise one or more phase locked loops (PLL) and one or more reference signal generators, such as a crystal oscillator. Additionally, the frequency synthesizer 124 may comprise one or more phase shifters and/or signal dividers such that two signals in phase quadrature may be generated.

The memory 128 may comprise suitable logic circuitry and/or code that may enable storing information. In this regard, the memory 128 may, for example, enable storing information utilized for controlling and/or configuring the frequency synthesizer 124. For example, the memory may store the value of state variables that may be utilized to control the frequency output by the frequency synthesizer 124. Additionally, the memory 128 may enable storing information that may be utilized to configure the FM Tx block 126 and the FM Rx block 132. In this regard, the FM RX block 126 and/or the FM tx block may comprise logic, circuitry, and/or code such as a filter, for example, that may be configured based on the desired frequency of operation.

The processor 130 may comprise suitable logic, circuitry, and/or code that may enable interfacing to the memory 128, the frequency synthesizer 124, the FM Rx block 126 and/or the FM Tx block 132. In this regard, the processor 130 may be enabled to execute one or more instruction that enable reading and/or writing to/from the memory 128. Additionally, the processor 130 may be enabled to execute one or more instruction that enable providing one or more control signals to the frequency synthesizer 124, the FM Rx block 126, and/or the FM Tx block 132.

The FM Rx block 126 may comprise suitable logic, circuitry, and/or code that may enable reception of FM signals. In this regard, the FM Rx block 126 may be enabled to tune to a desired channel, amplify received signals, down-convert received signals, and/or demodulate received signals to, for example, output data and/or audio information comprising the channel. For example, the FM Rx block 126 may utilize phase quadrature local oscillator signals generated by frequency synthesizer 124 to down-convert received FM signals. The FM Rx block may, for example, be enabled to operate over the "FM broadcast band", or approximately 60 MHz to 130 MHz. Signal processing performed by the FM Rx block 126 may be performed in the analog domain, or the FM Rx block 126 may comprise one or more analog to digital converters and/or digital to analog converters.

The FM Tx block 132 may comprise suitable logic, circuitry, and/or code that may enable transmission of FM signals. In this regard, the FM Tx block 132 may enable frequency modulation of a carrier signal generated by the clock frequency synthesizer 124. The FM Tx block 132 may also enable up-conversion of a modulated signal to a frequency, for example, in the "FM broadcast band", or approximately 60 MHz to 130 MHz. Additionally, the FM Tx block may enable buffering and/or amplifying a FM signal such that the signal may be transmitted via the antenna 136.

The FM Rx block 126 and the FM Tx block 132 may share an antenna or utilize separate antennas. In the case of a shared antenna, a directional couple, transformer, or some other circuitry may be utilized to couple the Tx output and Rx input to the single antenna. Additionally, any antennas utilized by the FM Tx block 132 and/or the FM Rx block 126 may be integrated into the same substrate as the system 120 or may be separate. Exemplary antenna configurations are further illustrated in FIGS. 3B, 3C, 3D, and 3E.

In an exemplary operation of the system 120, one or more signals provided by the processor 130 may configure the system 120 to either transmit or receive FM signals. To receive FM signals the processor may provide one or more signals to power up the FM Rx block 126 and power down the FM Tx block 132. Additionally, the processor may provide one or more control signals to the frequency synthesizer 124 in order to generate an appropriate LO frequency based the reference signal $f_{ref}$. In this regard, the processor may interface to the memory 128 in order to determine the appropriate state of any control signals provided to the frequency synthesizer 124. To transmit FM signals the processor may provide one or more signals to power up the FM Tx block 132 and power down the FM Rx block 126. Additionally, the processor may provide one or more control signals to the frequency synthesizer 124 in order to generate an appropriate LO frequency based on the reference frequency $f_{ref}$. In this regard, the processor may interface to the memory 128 in order to determine the appropriate state of any control signals.

Figure 3B:
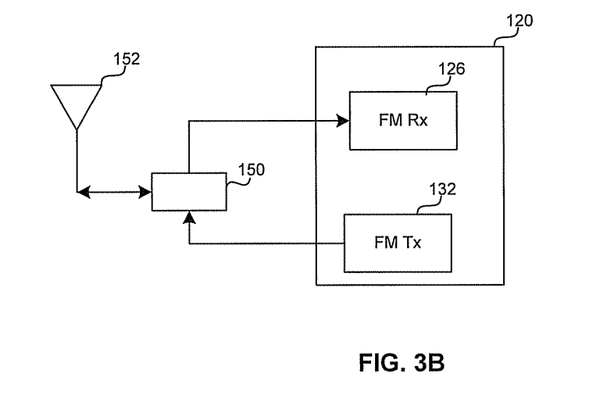
FIG. 3B is a block diagram illustrating a FM transceiver sharing an external antenna between transmit and receive functions, in connection with an embodiment of the invention.

FIG. 3B is a block diagram illustrating a FM transceiver sharing an external antenna between transmit and receive functions, in connection with an embodiment of the invention. Referring to FIG. 3B, there is shown a FM transceiver 120, a coupling device 150, and a bi-directional antenna 152. The antenna 152 may transmit and/or receive FM signals. The coupling device 150 may comprise suitable logic, circuitry, and/or code that may enable passing FM signals received via the antenna 152 to the FM Rx block 126. Additionally, the coupling device 150 may be enabled to pass signals from the FM Tx block 132 to the antenna 152 for transmission to a remote FM receiver.

Figure 3C:
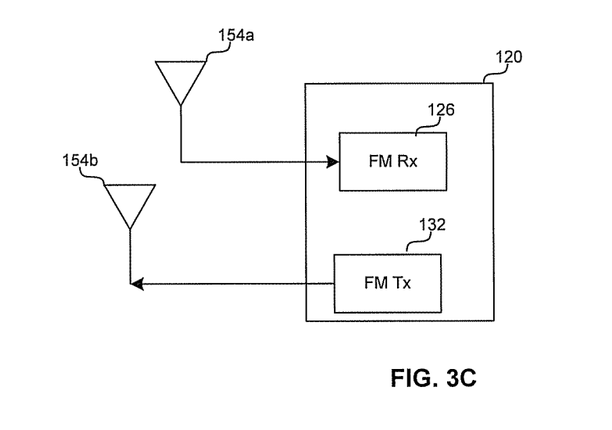
FIG. 3C is a block diagram illustrating a FM transceiver utilizing separate external receive and transmit antennas, in connection with an embodiment of the invention.

FIG. 3C is a block diagram illustrating a FM transceiver utilizing separate external receive and transmit antennas, in connection with an embodiment of the invention. Referring to FIG. 3C, there is shown a FM transceiver 120, a receive antenna 154a, and a transmit antenna 154b. The receive antenna 154a may receive FM signals and pass them to the FM Rx block 126. The transmit antenna 154b may receive FM signals from FM Tx block 132 and may transmit them for reception by a remote FM receiver.

Figure 3D:
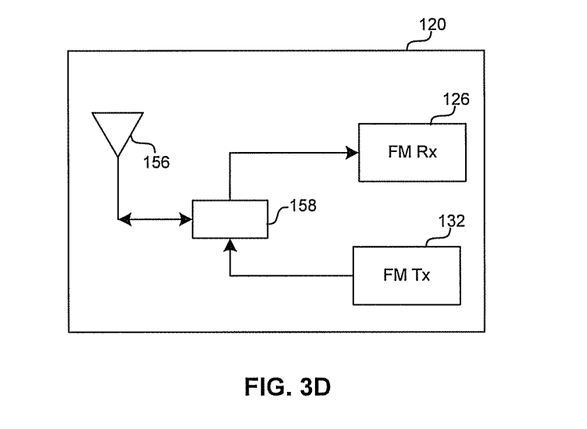
FIG. 3D is a block diagram illustrating a FM transceiver sharing an internal antenna between transmit and receive functions, in connection with an embodiment of the invention.

FIG. 3D is a block diagram illustrating a FM transceiver sharing an integrated antenna between transmit and receive functions, in connection with an embodiment of the invention. Referring to FIG. 3D, there is shown an integrated system comprising an FM transceiver 120, a coupling device 158, and an antenna 156. The antenna 156 may transmit and/or receive FM signals. The coupling device 150 may comprise suitable logic, circuitry, and/or code that may enable passing FM signals received via the antenna 156 to the FM Rx block 126. Additionally, the coupling device 150 may be enabled to pass signals from the FM Tx block 132 to the antenna 156 for transmission to a remote FM receiver.

Figure 3E:
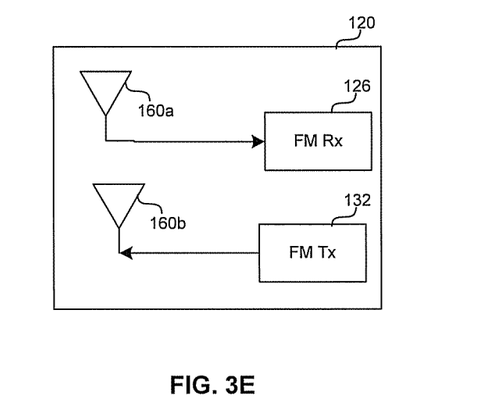
FIG. 3E is a block diagram illustrating a FM transceiver utilizing separate external receive and transmit antennas, in connection with an embodiment of the invention.

FIG. 3E is a block diagram illustrating a FM transceiver utilizing integrated receive and transmit antennas, in connection with an embodiment of the invention. Referring to FIG. 3E, there is shown an integrated system comprising a FM transceiver 120, a receive antenna 160a, and a transmit antenna 160b. The receive antenna 160a may receive FM signals and pass them to the FM Rx block 126. The transmit antenna 160b may receive FM signals from FM Tx block 132 and may transmit them for reception by a remote FM receiver.

FIG. 4A is an exemplary diagram of a System on Chip (SoC) with integrated RFID and FM radios, in accordance with an embodiment of the invention. Referring to FIG. 4A, the SoC 400 may comprise a RFID block 410 and an FM block 420.

The RFID block 410 may comprise suitable logic, circuitry, and/or code that may enable communicating with an RFID terminal. In this regard, the RFID block 410 may be similar to or the same as the RFID system 102 disclosed in FIG. 2. Moreover, the RFID block 410 may comprise a frequency synthesizer 412 that may be similar to or the same as the frequency synthesizer 114 disclosed in FIG. 2. Accordingly, the frequency synthesizer 412 may comprise a PLL utilized to generate a signal utilized in the communication of RFID data. One or more control signals may be provided by the RFID block 410 to the processor 130 and/or the memory 128. Similarly, one or more control signals may be provided by the memory 128 and/or the processor 130 to the RFID block 410. In this regard, digital information may be exchanged between the RFID block 410 and the FM block 420. For example, changes in operating frequency of the frequency synthesizer 412 may be communicated to the memory 128 and/or the processor 130 such that the control word to a DDFS block may be altered to compensate for the frequency change.

The FM block 420 may comprise suitable logic, circuitry, and/or code that may enable the transmission and/or reception of FM signals. In this regard, the FM block 420 may be similar to the FM system 120 disclosed in FIG. 3A. In contrast to the system 120, the FM block 420 may comprise a DDFS 422 instead of a traditional analog frequency synthesizer, such as the frequency synthesizer 124. Accordingly, the FM block 420 may be enabled to utilize reference signal of widely varying frequency. In this regard, the DDFS 422 may enable utilizing the output of the frequency synthesizer 412 to generate signals utilized by the FM block 420. In this manner, a reduction in power consumption and circuit size may be realized in the SoC 400 by sharing a single frequency synthesizer between the FM block 420 and the RFID block 410. Additional details of the DDFS 422 may be found in FIG. 4B.

In an exemplary operation of the system 120, one or more signals provided by the processor 130 may configure the FM block 420 to either transmit or receive FM signals. To receive FM signals, the processor 130 may provide one or more signals to power up the FM Rx block 126 and power down the FM Tx block 132. Additionally, the processor 130 may provide a control word to the DDFS 422 in order to generate an appropriate LO frequency based on the reference signal $f_{ref}$. In this regard, $f_{ref}$ may comprise an output of a PLL utilized by the RFID block 410. For example, the RFID block 410 may operate at 900 MHz and the frequency generator 412 may accordingly output a 900 MHz signal. The DDFS 422 may thus utilize the 900 MHz signal to generate, for example, signals in the "FM broadcast band", or approximately 60 MHz to 130 MHz.

The processor 130 may interface with the memory 128 in order to determine the appropriate state of any control signals and the appropriate value of the control word provided to the DDFS 122. To transmit FM signals the processor 130 may provide one or more signals to power up the FM Tx block 132 and power down the FM Rx block 126. Additionally, the processor 130 may provide a control word to the DDFS 422 in order to generate an appropriate LO frequency based on the reference signal $f_{ref}$. Alternatively, the processor 130 may provide a series of control words to the DDFS 422 in order to generate a FM signal. In this regard, the processor 130 may interface to the memory 128 in order to determine the appropriate state of any control signals and the appropriate values of the control word provided to the DDFS 422.

Figure 4B:
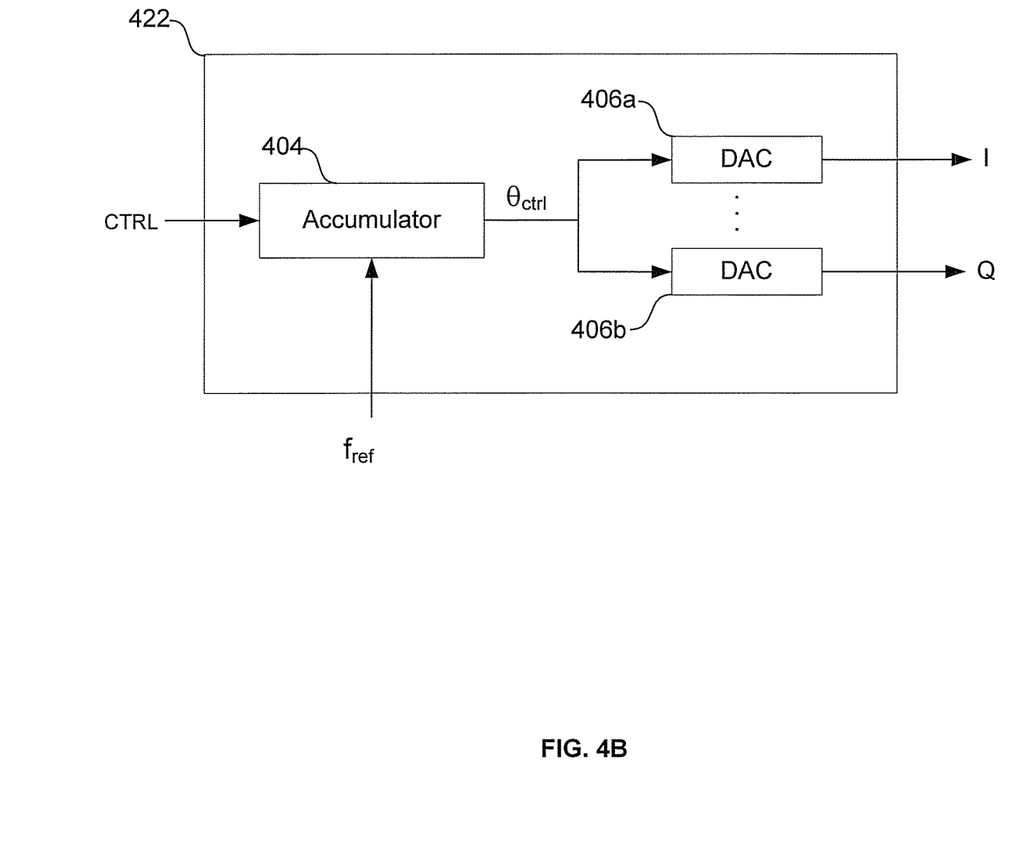
FIG. 4B is a block diagram of a direct digital frequency synthesizer (DDFS), in accordance with an embodiment of the invention.

FIG. 4B is a block diagram of a direct digital frequency synthesizer in accordance with an embodiment of the invention. In one embodiment, DDFS block 422 may comprise an accumulator 404 and two digital to analog conversion (DAC) blocks 406a and 406b.

Referring to FIG. 4B, the accumulator block 404 may comprise suitable logic, circuitry, and/or code to enable successively adding CTRL to a value stored in the accumulator on each cycle of a reference clock. The accumulator 404 may also receive a reference signal, $f_{ref}$, which may be fixed-frequency or may be of varying frequency. In the case of a varying $f_{ref}$, the change in frequency may be compensated for by altering CTRL such that the frequency output by the DDFS may be unaffected. In this regard, CTRL and $f_{ref}$ may determine phase and frequency of output signals I and Q. For example, I and Q may be in phase quadrature. Referring to FIG. 4B, the DAC blocks 406a and 406b may comprise suitable logic, circuitry, and/or code that may enable output of one or more signals of varying phase, frequency, or amplitude. In one embodiment, the DAC blocks 406a and 406b may comprise a number of lookup tables and/or one or more logic blocks used to generate output signals I and Q. In this manner, the DDFS block 422 is a digitally-controlled signal generator that may vary phase, frequency, and/or amplitude of one or more output signals based on a single reference clock, and a control word, CTRL.

In operation, CTRL may be provided to the accumulator 404, and may be successively added to a value stored in the accumulator 404 on each cycle of the reference clock. In this manner, the sum will eventually be greater than the maximum value the accumulator can store, and the value in the accumulator may overflow or "wrap". Accordingly, an N-bit accumulator will overflow at a frequency $f_{ddfs}$ given by EQ. 1.

$$f_{ddfs} = f_{ref}(CTRL/2^N)$$ EQ. 1

In this manner, the output of the accumulator, $\theta_{ctrl}$, will be periodic with period $1/f_{ddfs}$ and may represent the phase angle of a signal. In this regard, the DDFS is well suited as a frequency generator that outputs one or more sine waves or other periodic waveforms over a large range of frequencies, from almost DC to approximately half the reference clock frequency $f_{ref}$.

The DDFS 422 may, for example, be utilized in a time division duplexed (TDD) scheme in which it generates two frequencies, f1 and f2, in alternating time intervals. Moreover, the phase of f1 and f2 may be continuous such that little or no phase error is introduced when switching between frequencies. Additionally, prior to changing CTRL, the state of the DDFS may be saved in, for example, a memory such as the memory 128. In this manner, the output signal, f1 for example, may be interrupted and then resumed without losing the phase information comprising the generated signals. For example, each time the DDFS resumes generating f1, the saved state may be loaded from memory, and the signal f1 may resume from the last phase angle transmitted before the DDFS interrupted f1 to transmit f2. Accordingly, since phase continuity is maintained, rapidly switching between transmit and receive functions may have negligible effects on the generated signals I and Q. In this manner, the signals I and Q may appear as continuous, uninterrupted signals to the FM Rx block 126 and/or the FM Tx block 132 disclosed in FIG. 4A, for example. Time division duplexing may thus be utilized to simulate the simultaneous transmission and reception of FM signals.

Figure 5:
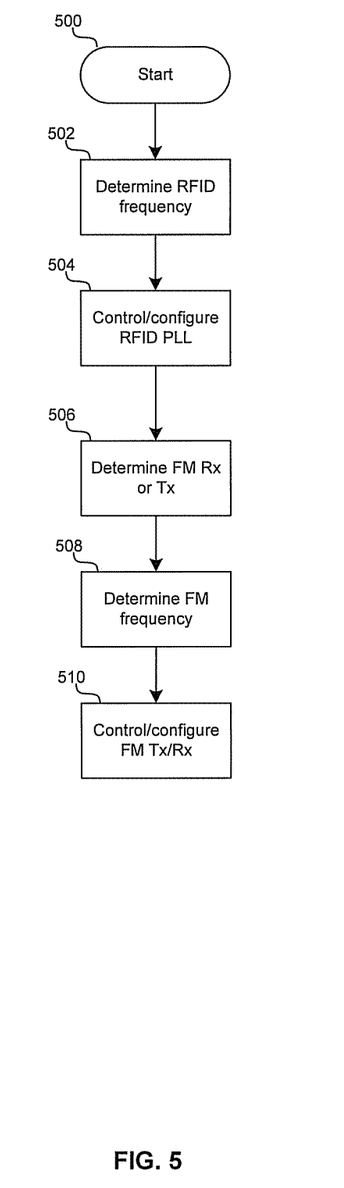
FIG. 5 is a flow chart illustrating exemplary steps in transmitting and/or receiving FM signals utilizing a DDFS clocked by a RFID PLL, in accordance with an embodiment of the invention.

FIG. 5 is a flow chart illustrating exemplary steps in transmitting and/or receiving FM signals utilizing a DDFS clocked by a RFID PLL, in accordance with an embodiment of the invention. In this regard, one or more of the exemplary step shown in FIG. 5 may be performed by a system such as the chip 400 illustrated in FIG. 4A. Referring to FIG. 5, subsequent to a start step 500, in step 502 an appropriate frequency to generate for RFID communications may be determined. For example, at start-up, the processor 130 described in FIG. 4A may read a default frequency setting from the memory 128. Subsequent to step 502 the exemplary steps may proceed to step 504.

In step 504 a PLL or other frequency synthesizer may be controlled/configured to generate the frequency determined in step 502. For example, the processor 130 may provide the value of N for a divide-by-N block of a PLL comprising the frequency synthesizer 412. Subsequent to step 504 the exemplary steps may proceed to step 506.

In step 506 it may be determined if one or more FM signals is to be transmitted or received. For example, a system such as the chip 400 may receive one or more signals indicating that FM reception or transmission is desired. For example, an external input may allow a user of the system 400 to switch the system 400 to a FM Tx or FM Rx mode. Accordingly, the processor 130 may output one or more control signals to, for example, power up the FM Rx block 126. Subsequent to step 506 the exemplary steps may proceed to step 508.

In step 508 an appropriate frequency for FM transmission and/or reception may be determined. For example, an external input may allow a user to configure a desired FM transmit and/or Receive frequency. Alternatively, the processor 130 may read a frequency setting from the memory 128. Subsequent to step 508 the exemplary steps may proceed to step 510.

In step 510, the FM Tx block 132 and/or the FM Rx block 126 may be configure to transmit or receive the frequency determined in step 508. In this regard, the processor 130 and/or the memory 128 may provide a control word to the DDFS 422. Accordingly, the control word may be such that the DDFS 422 outputs the frequency determined in step 508 when clocked by the PLL frequency determined in step 502. Additionally in step 510 the processor 130 may provide one or more control signals to configure the FM Tx block 126 and/or the FM Rx block 132. For example, the FM Tx block 132 and/or the FM Rx block 126 may comprise a digitally tunable bandpass filter that the processor 130 may configure to pass the FM frequency determined in Step 508.

Various embodiments of the invention may provide a machine-readable storage or computer readable medium having stored thereon, a computer program having at least one code section for transmission or reception of FM signal utilizing a DDFS clocked by an RFID PLL, the at least one code section being executable by a machine for causing the machine to perform steps as disclosed herein.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
   generating a first oscillator signal utilized for transmission and/or reception of signals in a first wireless communication system; and
   clocking a direct digital frequency synthesizer (DDFS) by said first oscillator signal to generate one or more second oscillator signals;
   adjusting a control word input to said DDFS for holding constant a frequency of said one or more second oscillator signals when a frequency of said first oscillator signal varies; wherein:
   said one or more second oscillator signals are modulated to generate a signal in a second wireless communication system; and/or
   said one or more second oscillator signals are utilized to demodulate signals in said second wireless communication system.

2. The method according to claim 1, comprising simulating simultaneous transmission and reception of signals in said second wireless communication system by switching said control word input to said DDFS between two values.

3. The method according to claim 1, comprising switching said control word input to said DDFS between two values in successive time intervals to perform time-division duplexing of transmission and reception of said signals in said second wireless communication system.

4. The method according to claim 3, wherein said transmission of said signals in said second wireless communication system occurs at a first frequency and said reception of said signals in said second wireless communication system occurs at a second frequency.

5. The method according to claim 1, wherein said frequency of said first oscillator signal is within one of the following frequency bands: 868 MHz to 928 MHz, 2.4 GHz to 2.483 GHz, and 5.725 to 5.875 GHz.

6. The method according to claim 1, wherein said frequency of each of said one or more second oscillator signals is within a frequency band of 60 MHz to 130 MHz.

7. The method according to claim 1, wherein each of said one or more signals comprises an in-phase component and a quadrature-phase component.

8. The method according to claim 1, comprising generating said first oscillator signal via a phase locked loop.

9. The method according to claim 8, wherein said phase locked loop operates at a substantially fixed frequency.

10. A system comprising: one or more circuits comprising a direct digital frequency synthesizer (DDFS), said one or more circuits being operable to:
    generate a first oscillator signal utilized for transmission and/or reception of signals in a first wireless communication system;
    clock said DDFS by said first oscillator signal to generate one or more second oscillator signals;
    adjust a control word input to said DDFS for holding constant a frequency of said one or more second oscillator signals when a frequency of said first oscillator signal varies: wherein:
    said one or more second oscillator signals are modulated to generate a signal in a second wireless communication system; and/or
    said one or more second oscillator signals are utilized to demodulate signals in said second wireless communication system.

11. The system according to claim 10, wherein said one or more circuits are operable to simulate simultaneous transmission and reception of signals in said second wireless communication system by switching said control word input to said DDFS between two values.

12. The system according to claim 10, wherein said one or more circuits switches said control word input to said DDFS between two values in successive time intervals to perform time-division duplexing of transmission and reception of signals in said second wireless communication system.

13. The system according to claim 12, wherein said transmission of said signals in said second wireless communication system occurs at a first frequency and said reception in said second wireless communication system occurs at a second frequency.

14. The system according to claim 10, wherein said frequency of said first oscillator signal is within one of the following frequency bands: 868 MHz to 928 MHz, 2.4 GHz to 2.483 GHz, and 5.725 to 5.875 GHz.

15. The system according to claim 10, wherein said frequency of each of said one or more second oscillator signals is within a frequency band of 60 MHz to 130 MHz.

16. The system according to claim 10, wherein each of said one or more second oscillator signals comprises an in phase component and a quadrature component.

17. The system according to claim 10, wherein said one or more circuits comprise a phase locked loop that generates said first oscillator signal.

18. The system according to claim 17, wherein said phase locked loop operates at a substantially fixed frequency.

* * * * *